United States Patent
Yoon et al.

(10) Patent No.: US 9,044,822 B2
(45) Date of Patent: Jun. 2, 2015

(54) TRANSIENT LIQUID PHASE BONDING PROCESS FOR DOUBLE SIDED POWER MODULES

(71) Applicant: Toyota Motor Engineering & Manufacturing North America, Inc., Erlanger, KY (US)

(72) Inventors: Sang Won Yoon, Ann Arbor, MI (US); Takehiro Kato, Ann Arbor, MI (US); Koji Shiozaki, Ann Arbor, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 155 days.

(21) Appl. No.: 13/957,320

(22) Filed: Aug. 1, 2013

(65) Prior Publication Data
US 2015/0008253 A1 Jan. 8, 2015

Related U.S. Application Data

(60) Provisional application No. 61/843,296, filed on Jul. 5, 2013.

(51) Int. Cl.
*B23K 31/02* (2006.01)
*B23K 20/00* (2006.01)
*B23K 20/02* (2006.01)
*H05K 13/00* (2006.01)
*B23K 1/00* (2006.01)

(52) U.S. Cl.
CPC .......... *B23K 20/02* (2013.01); *H05K 13/0023* (2013.01); *B23K 1/0016* (2013.01); *B23K 2201/36* (2013.01)

(58) Field of Classification Search
None
See application file for complete search history.

(56) References Cited

U.S. PATENT DOCUMENTS

| | | |
|---|---|---|
| 4,551,904 A | 11/1985 | Berenz et al. |
| 5,113,145 A | 5/1992 | Ideler et al. |
| 5,152,695 A | 10/1992 | Grabbe et al. |
| 5,166,774 A | 11/1992 | Banerji et al. |
| 5,225,633 A | 7/1993 | Wigginton |

(Continued)

FOREIGN PATENT DOCUMENTS

| | | |
|---|---|---|
| CA | 2513914 A1 * | 4/2006 |
| DE | 102009050426 | 3/2011 |

(Continued)

OTHER PUBLICATIONS

Bontemps et al.; "Low Profile Power Module Combined with State of the Art MOSFET Switches and SiC Diodes Allows High Frequency and Very Compact Three-Phase Sinusoidal Input Rectifiers" Proc. of the Conf. for Power Electronics, Intellectual Motion and Power Quality; 6 pages; 2007.

(Continued)

*Primary Examiner* — Kiley Stoner
(74) *Attorney, Agent, or Firm* — Snell & Wilmer LLP

(57) ABSTRACT

A double-sided bonding process using transient liquid phase (TLP) bonding structure. A first side of an electronic device is processed to partially complete bonding. A second side of the electronic device is processed to complete bonding. The first side completes bonding during the processing of the second side. This reduces the time needed for the bonding process of both sides. This process allows for various TLP bonding parameters while being compatible with conventional fabrication systems.

20 Claims, 8 Drawing Sheets

(56) References Cited

U.S. PATENT DOCUMENTS

| | | | |
|---|---|---|---|
| 5,234,152 A | 8/1993 | Glaeser | |
| 5,280,139 A | 1/1994 | Suppelsa et al. | |
| 5,289,967 A | 3/1994 | Bampton et al. | |
| 5,372,298 A * | 12/1994 | Glaeser | 228/195 |
| 5,381,944 A | 1/1995 | Makowiecki et al. | |
| 5,402,926 A | 4/1995 | Takeuchi et al. | |
| 5,416,429 A | 5/1995 | McQuade et al. | |
| 5,432,998 A | 7/1995 | Galasco et al. | |
| 5,542,602 A | 8/1996 | Gaynes et al. | |
| 5,613,861 A | 3/1997 | Smith et al. | |
| 5,821,827 A | 10/1998 | Mohwinkel et al. | |
| 5,830,289 A | 11/1998 | El-Soudani | |
| 5,836,075 A | 11/1998 | Fitzgerald et al. | |
| 5,847,572 A | 12/1998 | Iwasaki et al. | |
| 5,910,341 A | 6/1999 | Fey et al. | |
| 5,935,430 A | 8/1999 | Craig | |
| 5,997,708 A | 12/1999 | Craig | |
| 6,098,871 A | 8/2000 | Cairo et al. | |
| 6,199,751 B1 | 3/2001 | Gaynes et al. | |
| 6,257,481 B1 | 7/2001 | Shirzadi-Ghoshouni et al. | |
| 6,303,992 B1 | 10/2001 | Van Pham et al. | |
| 6,330,164 B1 | 12/2001 | Khandros et al. | |
| 6,444,921 B1 | 9/2002 | Wang et al. | |
| 6,529,022 B2 | 3/2003 | Pierce | |
| 6,602,053 B2 | 8/2003 | Subramanian et al. | |
| 6,624,484 B2 | 9/2003 | Christensen | |
| 6,669,489 B1 | 12/2003 | Dozier et al. | |
| 6,772,501 B2 * | 8/2004 | Barker et al. | 29/592.1 |
| 6,790,684 B2 | 9/2004 | Ahn et al. | |
| 6,836,011 B2 | 12/2004 | Azuma | |
| 6,845,901 B2 | 1/2005 | Koopmans | |
| 6,864,588 B2 | 3/2005 | Hung | |
| 6,937,037 B2 | 8/2005 | Eldridge et al. | |
| 6,958,531 B2 | 10/2005 | Ucok et al. | |
| 6,975,518 B2 | 12/2005 | Frutschy et al. | |
| 6,992,520 B1 | 1/2006 | Herbert | |
| 7,002,249 B2 | 2/2006 | Duffy et al. | |
| 7,049,693 B2 | 5/2006 | Canella | |
| 7,120,999 B2 | 10/2006 | Canella | |
| 7,165,712 B2 | 1/2007 | Abdo et al. | |
| 7,245,137 B2 | 7/2007 | Eldridge et al. | |
| 7,259,625 B2 | 8/2007 | Sanderson | |
| 7,279,788 B2 | 10/2007 | Canella | |
| 7,297,989 B2 | 11/2007 | Otani et al. | |
| 7,301,358 B2 | 11/2007 | Jovanovic et al. | |
| 7,335,931 B2 | 2/2008 | Alm | |
| 7,396,236 B2 | 7/2008 | Eldridge et al. | |
| 7,398,912 B2 * | 7/2008 | Shinkai et al. | 228/122.1 |
| 7,451,907 B2 | 11/2008 | Sigler et al. | |
| 7,495,877 B2 | 2/2009 | Havanur | |
| 7,511,521 B2 | 3/2009 | Richmond, II et al. | |
| 7,527,090 B2 | 5/2009 | Dani et al. | |
| 7,541,681 B2 | 6/2009 | Otremba | |
| 7,579,848 B2 | 8/2009 | Bottoms et al. | |
| 7,583,101 B2 | 9/2009 | Miller | |
| 7,612,456 B2 | 11/2009 | Fujii et al. | |
| 7,628,309 B1 | 12/2009 | Eriksen et al. | |
| 7,659,614 B2 | 2/2010 | Mehrotra | |
| 7,867,563 B2 | 1/2011 | Arase et al. | |
| 8,076,696 B2 | 12/2011 | Beaupre et al. | |
| 8,168,490 B2 | 5/2012 | Hebert | |
| 8,240,545 B1 * | 8/2012 | Wang et al. | 228/123.1 |
| 8,348,139 B2 * | 1/2013 | Liu et al. | 228/246 |
| 8,513,806 B2 * | 8/2013 | Otsuka et al. | 257/751 |
| 8,803,001 B2 * | 8/2014 | Yoon et al. | 174/261 |
| 8,814,030 B2 * | 8/2014 | Yoon | 228/234.1 |
| 2002/0092895 A1 | 7/2002 | Blackshear et al. | |
| 2002/0110008 A1 | 8/2002 | Miyazaki et al. | |
| 2002/0148880 A1 * | 10/2002 | Brink | 228/194 |
| 2003/0099097 A1 | 5/2003 | Mok et al. | |
| 2003/0127495 A1 * | 7/2003 | Curcio et al. | 228/180.21 |
| 2003/0173499 A1 | 9/2003 | Cole et al. | |
| 2004/0058470 A1 | 3/2004 | Canella | |
| 2004/0072456 A1 | 4/2004 | Dozier et al. | |
| 2004/0183207 A1 | 9/2004 | Jeung et al. | |
| 2004/0262742 A1 | 12/2004 | DiStefano et al. | |
| 2005/0011937 A1 * | 1/2005 | Brink | 228/245 |
| 2005/0026351 A1 | 2/2005 | Farrar | |
| 2005/0035347 A1 | 2/2005 | Khandros et al. | |
| 2005/0257877 A1 | 11/2005 | Stark | |
| 2006/0071056 A1 | 4/2006 | Das | |
| 2006/0283921 A1 * | 12/2006 | Ciona et al. | 228/246 |
| 2007/0075422 A1 | 4/2007 | Fujii et al. | |
| 2007/0144841 A1 | 6/2007 | Chong et al. | |
| 2007/0152026 A1 | 7/2007 | Suh et al. | |
| 2007/0259539 A1 | 11/2007 | Brown et al. | |
| 2007/0269997 A1 | 11/2007 | Eldridge et al. | |
| 2008/0003777 A1 | 1/2008 | Slater et al. | |
| 2008/0061808 A1 | 3/2008 | Mok et al. | |
| 2008/0073665 A1 | 3/2008 | Slater et al. | |
| 2008/0090429 A1 | 4/2008 | Mok et al. | |
| 2008/0156475 A1 | 7/2008 | Suh | |
| 2008/0157799 A1 | 7/2008 | Gritters et al. | |
| 2008/0185713 A1 | 8/2008 | Dani et al. | |
| 2008/0210971 A1 | 9/2008 | Donofrio et al. | |
| 2008/0213612 A1 | 9/2008 | Starikov et al. | |
| 2008/0253098 A1 | 10/2008 | Liu | |
| 2009/0004500 A1 * | 1/2009 | Suh et al. | 428/576 |
| 2009/0085191 A1 | 4/2009 | Najafi et al. | |
| 2009/0142707 A1 | 6/2009 | Eldridge et al. | |
| 2009/0153165 A1 | 6/2009 | Chong et al. | |
| 2009/0242121 A1 | 10/2009 | Suh | |
| 2010/0072555 A1 | 3/2010 | Meng et al. | |
| 2010/0183896 A1 | 7/2010 | Liu et al. | |
| 2011/0009979 A1 | 1/2011 | Shaw et al. | |
| 2011/0064363 A1 * | 3/2011 | Steijer et al. | 385/88 |
| 2011/0163445 A1 | 7/2011 | Chakrapani et al. | |
| 2011/0180777 A1 | 7/2011 | Afzali-Ardakani et al. | |
| 2011/0240717 A1 | 10/2011 | Song et al. | |
| 2012/0112201 A1 * | 5/2012 | Otsuka et al. | 257/76 |
| 2013/0001782 A1 * | 1/2013 | Otsuka et al. | 257/751 |
| 2013/0092948 A1 * | 4/2013 | Otsuka | 257/76 |
| 2013/0201631 A1 * | 8/2013 | Parker et al. | 361/728 |
| 2013/0270326 A1 * | 10/2013 | Yoon et al. | 228/176 |
| 2013/0335921 A1 * | 12/2013 | Nagatomo et al. | 361/709 |
| 2014/0002952 A1 * | 1/2014 | McConnell et al. | 361/301.4 |
| 2014/0177132 A1 * | 6/2014 | McConnell et al. | 361/305 |
| 2014/0193658 A1 * | 7/2014 | Ross et al. | 428/576 |

FOREIGN PATENT DOCUMENTS

| | | |
|---|---|---|
| JP | 2004165186 | 6/2004 |
| JP | 2007189154 | 7/2007 |
| JP | 2007287927 | 11/2007 |
| JP | 2010134082 | 6/2010 |

OTHER PUBLICATIONS

Bosco et al.; "Critical Interlayer Thickness for Transient Liquid Phase Bonding in the Cu-Sn System"; Acta Materialia 52; pp. 2965-2972; 2004.

Chen et al.; "Effect of Bonding Pressure on Transient Liquid Phase Bonding Joint Microstructure and Properties of T91/12Cr2MoWVTiB"; Advanced Materials Research; vols. 97-101; pp. 107-110; 2010.

Dodge; "Eliminating Parasitic Oscillation Between Parallel MOSFETs"; application Note APT-0402 Rev A; 6 pages, Mar. 25, 2004.

Farruggia et al.; "Hybrid Modules as an Alternative to Paralleled Discrete Devices"; International Symposium on Microelectornics; vol. 4587; 399-404, Oct. 9, 2001.

Frederikse et al.; "Thermal and Electrical Properties of Copper-tin and Nickel-tin Intermetallics"; AIP Journal of Applied Physics; vol. 72, No. 1, pp. 2879-2882; Oct. 1, 1992.

Grossi; "Self Assembly of Die to Wafer Using Direct Bonding Methods and Capillary Techniques," 207, 2010.

Guth et al.; "New Assembly and Interconnects Beyond Sintering Methods"; PCIM 2010; pp. 232-237; May 4-6, 2010.

Hikasa, K.; "Development of Flexible Bumped Tape Interposer"; Furukawa Review; No. 24; pp. 59-64; 2003.

Hille et al.: "Failure Mechanism and Improvement Potential of IGBT's Short Circuit Operation"; Proceedings of the $22^{nd}$ Interna-

(56) References Cited

OTHER PUBLICATIONS tional Symposium on Power Semiconductor Devices & ICs Hiroshima; pp. 33-36; 2010.

Kang et al.; "Isothermal Solidification of Cu/Sn Diffusion Couples to Form thin-Solder Joints"; Journal of Electronic Materials; vol. 31, No. 11; 2002.

MacDonald et al.; "Transient Liquid Phase Bonding Processes"; The Minerals, Metals & Materials Society; pp. 93-100; 1992.

Mustain, et al.; "Transient Liquid Phase Die Attach for High-Temperature Silicon Carbide Power Devices"; IEEE Transactions on Components and Packaging Technologies; V. 33, No. 3; pp. 563-570; Sep. 2010.

Rowden, et al.; "High Temperature SiC Power Module Packaging"; Proceedings of the ASME 2009 International Mechanical Engineering Congress & Exposition IMECE2009 Nov. 13-19.

Welch, III et al.; "Transfer of Metal MEMS Packages Using a Wafer-Level Solder Transfer Technique"; IEEE Transactions on Advanced Packaging; V. 28, No. 4; pp. 643-649; Nov. 2005.

Zheng et al.; "Partial Transient Liquid-Phase Bonding of $Si_3N_4$ with Ti/Cu/Ni Multi-Interlayers"; pp. 2026-2028; 1997.

* cited by examiner

TRANSIENT LIQUID PHASE BONDING PROCESS FOR DOUBLE SIDED POWER MODULES

CROSS REFERENCE TO RELATED APPLICATIONS

This application claims the benefit and priority of U.S. Provisional Application No. 61/843,296, filed on Jul. 5, 2013, which is hereby incorporated by reference in its entirety. This application incorporates by reference the entire contents of U.S. patent application Ser. No. 13/448,632, filed on Apr. 17, 2012.

BACKGROUND

1. Field

The present invention relates to alloy formation, and more particularly, to double-sided bonding using transient liquid phase (TLP) bonding in power electronics.

2. Description of the Related Art

Double-sided bonding of power devices and other electrical devices allows for power module structures having improved thermal and electrical performance by attaching components to both the top and bottom sides of an electronic device. For example, double-sided bonding allows for double-sided cooling or chip-on-chip designs. Solder, either lead or lead-free, is commonly used for double-sided bonding.

Since the same solder is used as the bonding material for both the top and bottom sides, the bonding materials of the top and bottom sides have the same process and melting temperatures. Therefore, the top and bottom sides can be simultaneously bonded in the same soldering process. Because multiple devices need to be aligned and bonded, simultaneous bonding requires a complex assembly process. For instance, when placing the power device and the top and bottom components in a fixture for soldering, the top component and the power device may obscure the view of the bottom component, which complicates checking the alignment. Solder reflow may further create misalignment. Alternatively, different solders may be used for the top and bottom sides, requiring different process and melting temperatures, but allowing for a sequential bonding process. One side of the device is soldered first, then checked for alignment, and subsequently the other side is soldered.

SUMMARY

The present invention is generally directed to double-sided bonding via transient liquid phase (TLP) bonding in power electronics. In various implementations, a technology to improve bonding quality and fabrication reliability of bonding technologies for electronic devices is disclosed.

TLP enables fast and reliable fabrication of a substantially homogeneous bondline with reduced dependency of a thickness limitation. Stated another way, a substantially homogeneous bondline made of substantially a single alloy without a thickness limitation and excessive bonding time can be achieved using the techniques disclosed herein. A (more) suitable bondline providing better and targeted performance for power electronics may also be achieved. Because the resulting bond has a re-melting temperature (i.e., a sustainable temperature) significantly larger than its bonding temperature, TLP may be particularly useful for high temperature power electronic devices, such as electronic devices fabricated from silicon, SiC, GaN, etc. For example, TLP bonding is at least applicable to automotive (including hybrid, plug-in hybrid, and/or electrical vehicles), watercraft, aerospace, nuclear, and/or electronics industries. TLP bonding is highly adaptable and is at least applicable to wafer-to-wafer, die-to-wafer, die-to-substrate, or die-to-die bonding. Moreover, this system is compatible with conventional fabrication techniques and can be adapted for use in double-sided bonding.

BRIEF DESCRIPTION OF THE DRAWINGS

The features and advantages of the implementations of the present invention will become more apparent from the detailed description set forth below when taken in conjunction with the drawings. Naturally, the drawings and their associated descriptions illustrate example arrangements within the scope of the claims and do not limit the scope of the claims. Reference numbers are reused throughout the drawings to indicate correspondence between referenced elements.

DETAILED DESCRIPTION

In the following detailed description, numerous specific details are set forth to provide an understanding of the present invention. It will be apparent, however, to one ordinarily skilled in the art that elements of the present invention may be practiced without some of these specific details. In other instances, well-known structures and techniques have not been shown in detail to avoid unnecessarily obscuring the present invention.

The present invention is generally directed to an improved bonding via transient liquid phase bonding in power electronics. Transient liquid phase (TLP) bonding produces joints that have microstructural and hence mechanical properties different to those properties of the base materials. TLP bonding differs from solder bonding in which diffusion occurs when a melting point depressant element from an interlayer moves into lattice and grain boundaries of the substrates at the bonding temperature. Solid state diffusional processes lead to a change of composition at the bond interface and one parent material has a low melting temperature, which melts and works as an interlayer, and another parent material with a high melting temperature. Thus, a thin layer of liquid spreads along the interface to form a joint at a lower temperature than the melting point of the parent material with the high melting temperature. A reduction in bonding temperature leads to solidification of the melt, and this phase can subsequently be diffused away into the parent materials by holding at bonding temperature.

Figure 1:
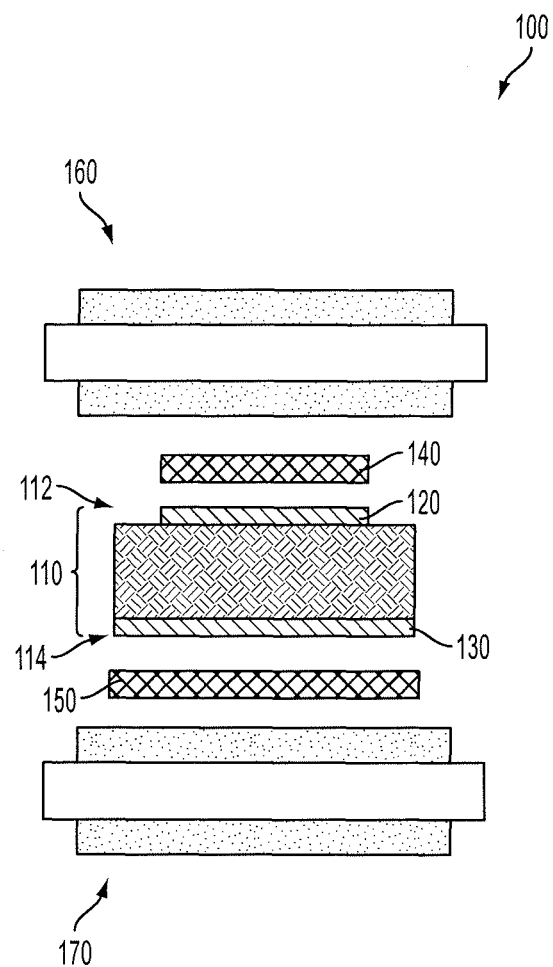
FIG. 1 depicts a diagram of a double-sided bonding structure according to one implementation of the present invention.

Double-sided bonding can produce advanced power modules and other electronic devices. Double-sided bonding refers to a technique where components are attached to both the top and bottom sides of an electronic device. FIG. 1 depicts a double-sided bonding structure 100 including a device 110. The device 110 has a top side 112, upon which a top metal layer 120 is disposed. The device 110 also has a bottom side 114, upon which a bottom metal layer 130 is disposed. A top-side bonding material 140 bonds a top-side bonding objective 160 to the top side 112. Similarly, a bottom-side bonding material bonds a bottom-side bonding objective 170 to the bottom side 114.

Conventionally, a simultaneous bonding process with solder is used for double-sided bonding. The top-side bonding material 140 and the bottom-side bonding material 150 are the same solder. The solder is applied to both the top side 112 and the bottom side 114, and the top-side bonding objective 160 and the bottom-side bonding objective 170 are respectively placed on the top side 112 and the bottom side 114. The double-sided bonding structure 100 undergoes processing to activate the solder. However, both sides cannot be reliably soldered at the same time because of reflow and other misalignment issues and fine process control considerations.

Solder may be used in sequential bonding processes as well, though not as common as simultaneous bonding. The top-side bonding material 140 and the bottom-side bonding material 150 are solders having different melting temperatures. The device 110 is placed in a fixture (not shown) to bond a first side. Throughout this disclosure, the bottom side will be described as being bonded first. However, the top side may be bonded first instead such that either the bottom side or the top side may be the first side, and the opposite side being the second side. The bottom side 114 is soldered to the bottom-side bonding objective 170. The device 110 is inspected for alignment of the bottom-side bonding objective 170 before bonding the second side, because the top-side bonding objective 160 can obscure or prevent inspection of the alignment of the bottom side 114. The device 110 may be removed from the fixture for inspection before being placed back into the fixture to solder the top side 112. In this type of sequential bonding, the top-side bonding material 140 and the bottom-side bonding material 150 are different solders, because the pre-bonding on the bottom side (first side) would melt and be damaged during the bonding of the top side (second side).

Figure 2A:
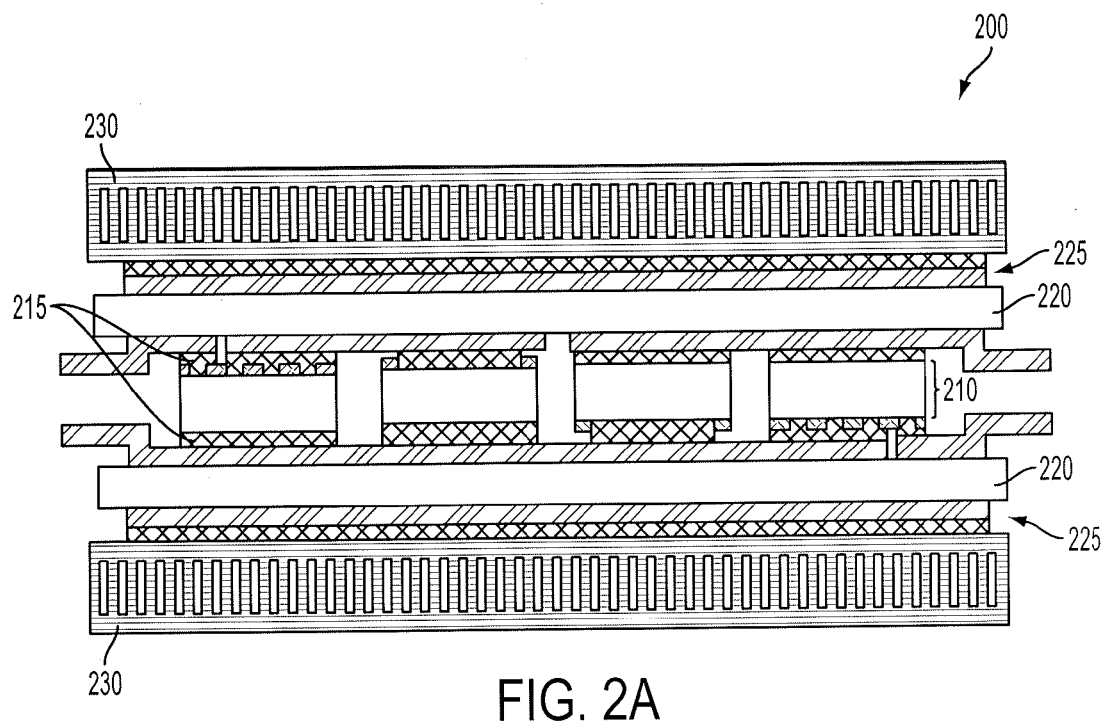
FIG. 2A depicts a double-sided cooling structure without spacers according to one implementation of the present invention.
Figure 2B:
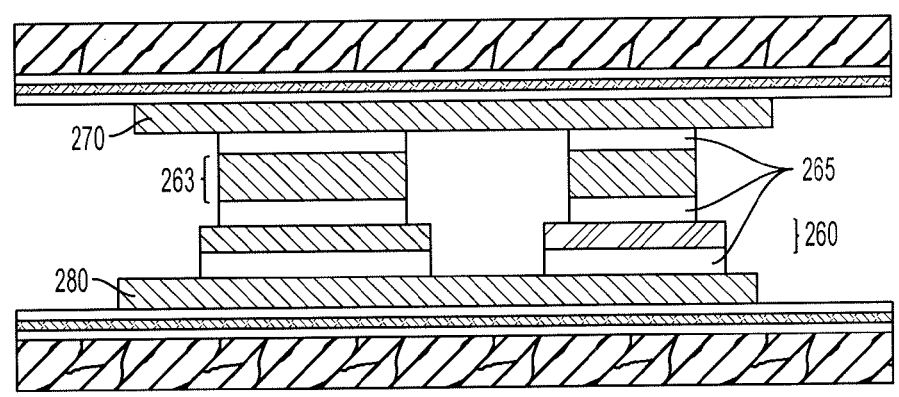
FIG. 2B depicts a double-sided cooling structure with spacers according to one implementation of the present invention.

FIGS. 2A and 2B show examples of double-sided bonding structures. FIG. 2A depicts a double-sided bonding structure 200. In FIG. 2A, dies 210, which may be insulated-gate bipolar transistors (IGBT), metal-oxide-semiconductor field-effect transistors (MOSFET), junction gate field-effect transistors (JFET), diodes, or other electronic component, are double-sided bonded through a die attach 215 to insulated substrates 220, which may be direct bonded copper (DBC), direct bonded aluminum (DBA), or active metal brazing (AMB) substrates. The substrates 220 are further connected through a cooler attach 225 to cold plates 230.

FIG. 2B illustrates a double-sided bonding structure 250 having spacers 263. In FIG. 2B, dies 260, which may be an IGBT, MOSFET, JFET, a diode, or other electronic component, are connected through a solder 265 to a collector plate 280 on the bottom side. On the top side, the dies 260 are soldered to the spacers 263, which are further soldered to an emitter plate 270.

Figure 3:
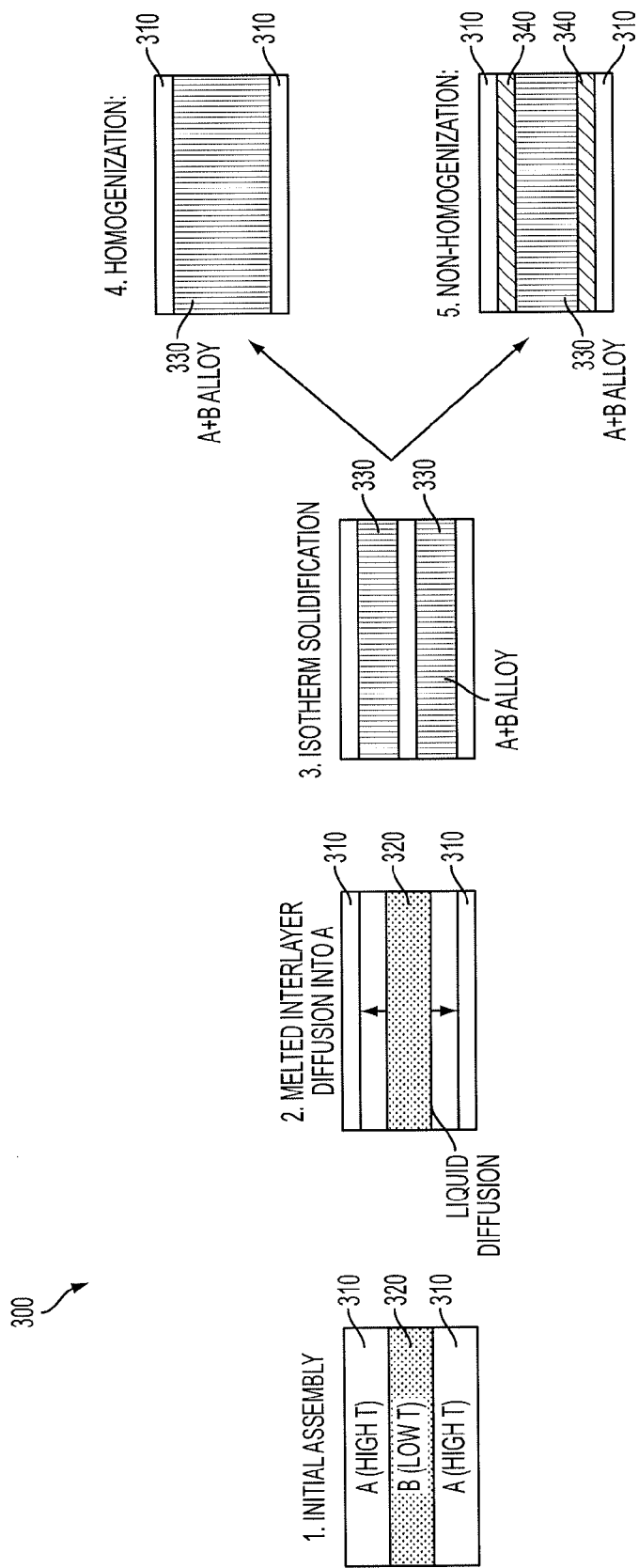
FIG. 3 depicts a flow diagram of a transient liquid phase (TLP) bonding process according to one implementation of the present invention.

TLP bonding can be applied to double-sided bonding, for example, by replacing the soldering process. As stated above, TLP bonding has a higher re-melting temperature than soldering. Unlike soldering, TLP further provides the option of simultaneous or sequential bonding. The bonding material and its thickness may be selected to suit the application. TLP further allows bonding to various types of materials, such as spacers made of different materials than the device. FIG. 3 depicts a system and method 300 utilizing TLP bonding.

TLP bonding may be effective for high power semiconductor devices because the re-melting temperature (i.e., sustainable temperature) is significantly larger than the bonding temperature or diffusion/solidification temperature. TLP may be useful in many electronic devices, especially for high temperature power electronic devices, such as those made of silicon, SiC, GaN, etc.

An overview of TLP is illustrated in FIG. 3. In general, two (or multiple) materials are involved with TLP bonding. As depicted, two materials denoted as material A 310 (that has a high melting temperature) and material B 320 (that has a low melting temperature with respect to the melting temperature of material A 310), which is also referred to as the center material. It should be appreciated that both the material A 310 and the material B 320 (center material) need not be pure in composition. As bonding temperature increases, the material B 320 begins to melt and diffuse into the material A 310, as shown at step 2 of FIG. 3. The diffused materials may sequentially react with the material B 320 and form an alloy via isothermal solidification. The solidification may continue until the bondline becomes a complete set of A+B alloy, such as depicted in step 4 of FIG. 3 (e.g., homogeneous bondline). Mechanical pressure (such as the range of several kPa to several MPa, such as from 3 kPa to 1 MPa) may be applied during the TLP bonding process.

In some TLP materials, multiple A+B alloys may generate multiple compounds such as depicted in step 5 of FIG. 3 leading to the non-homogeneous bondline. This non-homogenous bondline is often considered to be non-ideal because of its non-uniformity, inconsistency, uncontrollability, and unpredictable quality, which may present problems for production. For example, copper-tin (Cu—Sn) are TLP materials that may generate multiple Cu—Sn compounds (or alloys). As both copper and tin are widely employed in power electronics materials, in various implementations, the methods 300 of this disclosure are configured to minimize the non-homogeneous bondline generation.

In general, a particular alloy of the multiple available alloys may be more suitable for power electronics applications, due to the high power usage and high temperature generation of the power electronics, such as a conductive bondline. For example, the $Cu_3Sn$ alloy has a higher electrical conductivity as compared to $Cu_6Sn_5$, even though both alloys are generated during the Cu—Sn TLP bonding process ($Cu_3Sn$ corresponds to alloy B+ and $Cu_6Sn_5$ corresponds to alloy A+). Thus, for power electronics, a target may be to utilize a process to create a homogeneous bondline made of the preferred material (e.g., $Cu_3Sn$ alloy instead of $Cu_6Sn_5$). The above disclosed needs are successfully met via the disclosed system and method 300. In addition, table 1 below illustrates a non-exhaustive list of additional bonding materials.

TABLE 1

| Material System | Bonding Process | Remelt Temp. |
| --- | --- | --- |
| Copper-Tin | 4 min at 280° C. | >415° C. |
| Silver-Tin | 60 min at 250° C. | >600° C. |
| Silver-Indium | 120 min at 175° C. | >880° C. |
| Gold-Tin | 15 min at 260° C. | >278° C. |
| Gold-Indium | 0.5 min at 200° C. | >495° C. |
| Nickel-Tin | 6 min at 300° C. | >400° C. |

In various implementations, the method 300 may be utilized to achieve a homogeneous bondline made of a single alloy. For instance, a single alloy may be achieved based on attributes targeted to power electronics applications. One example alloy is $Cu_3Sn$ which is more suitable in power electronics compared to other alloys, such as $Cu_6Sn_5$. The method 300 may be configured to fabricate a thick bondline, which is advantageous in reducing bondline stress induced by high temperature. Also, aiding in mass production, the present system does not require long bonding time and is less depend on fabrication conditions. For instance, the bonding process of the method 300 is between about 30 minutes to about 2 hours. The method 300 provides excellent contact and good electrical and thermal conductivity to bonded devices, and therefore, improves device performance as well as bonding quality over prior techniques.

Multiple structures and fabrication options are proposed. Various materials may be used. Also, a pre-treatment of a material surface may be performed. This variety enables a flexible design and fabrication process and easy translation of this technology to many applications, such as double-sided bonding.

Figures 4A, 4B:
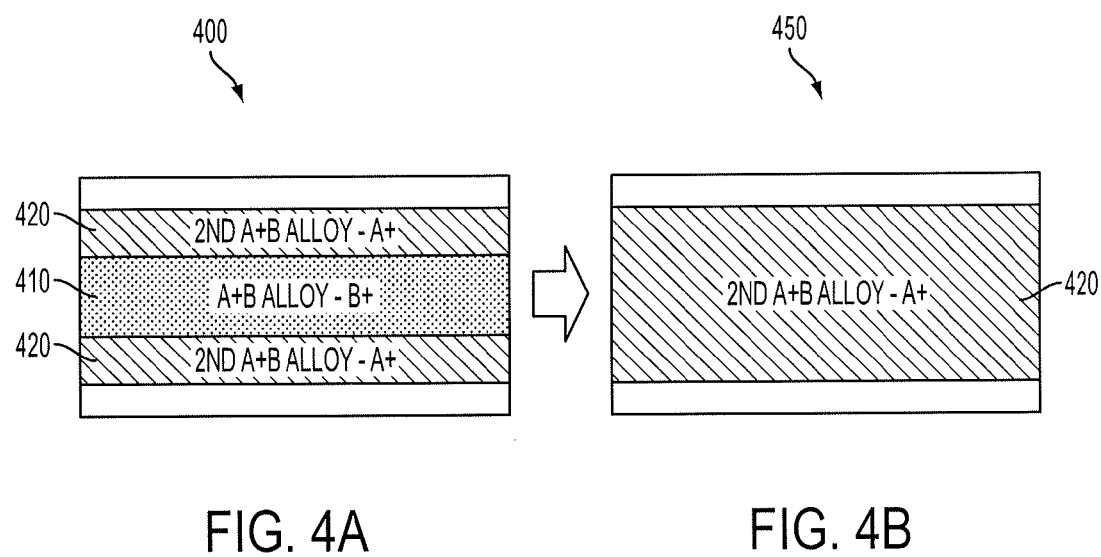
FIGS. 4A and 4B depict cross-sectional views of a transition from a multiple alloy bondline to a single alloy bondline according to one implementation of the present invention.

FIGS. 4A and 4B depict cross-sectional views of a transition from a multiple alloy bondline to a single alloy bondline. In a bonding state 400 of FIG. 4A, the bonding process may be complete because material B has transformed to a first alloy 410, an A+B alloy. The first alloy 410 is generally sandwiched between two layers of a second alloy 420, as the diffusion has not completed, similar to step 5 of FIG. 3. Although the bondline in the bonding state 400 is not homogeneous, the non-homogenous bondline produces a suitable bond. In a bonding state 450 of FIG. 4B, the material has substantially diffused such that the two materials now form a single alloy, the second alloy 420. The homogeneous bondline of the bonding state 450 may provide a stronger bond than the non-homogeneous bondline of FIG. 4A.

Figure 5C:
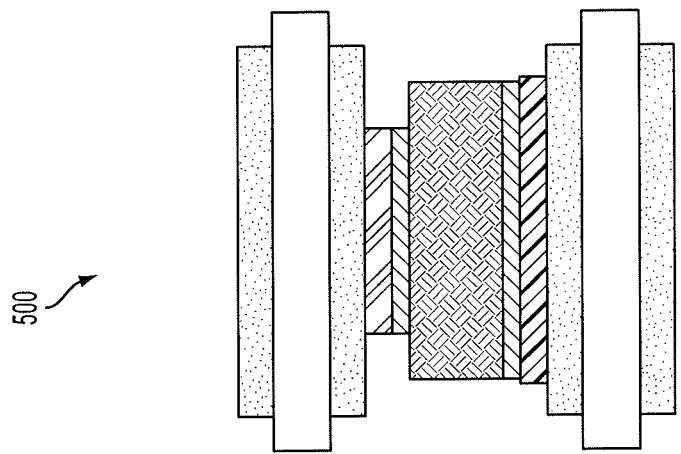
FIGS. 5A-5C depict cross-sectional views of a sequential double-sided bonding process according to one implementation of the present invention.
Figure 5B:
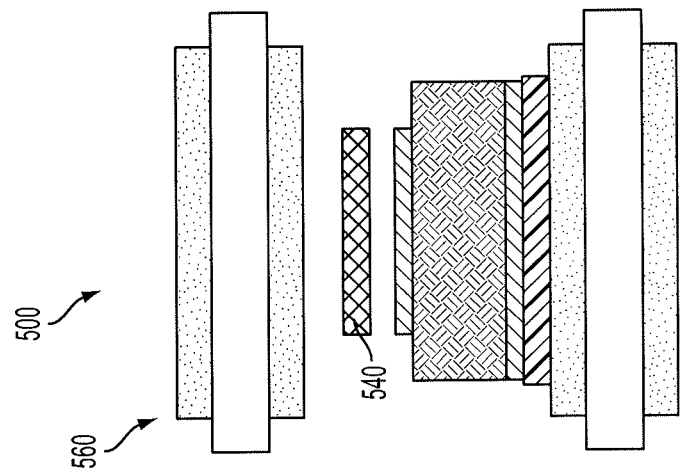
Figure 5A:
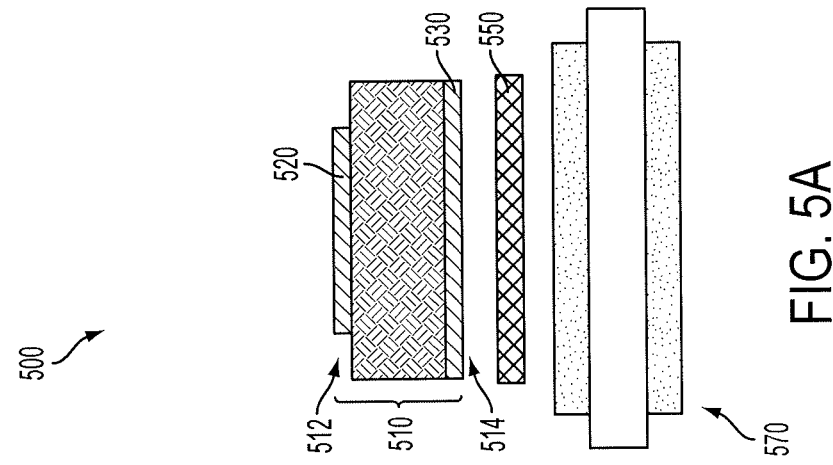

FIGS. 5A-5C depict a sequential double-sided bonding process 500 using TLP bonding. In FIG. 5A, a device 510 has a top side 512 upon which a top-side metal layer 520 is disposed, and a bottom side 514 upon which a bottom-side metal layer 530 is disposed. The top-side metal layer 520 and the bottom-side metal layer 530 may comprise the same or different metal or metal alloy, or may comprise more than one metal, such as a thin gold layer over another metal. A bottom-side bonding material 550, which may be a suitable TLP material such as a first material sandwiched between two layers of a second material as described above, is applied between the bottom-side metal layer 530 and a bottom-side bonding objective. The bottom side 514 is then processed such that the first bonding is complete (i.e., the first material forms an alloy as in steps 4 or 5 in FIG. 3).

In FIG. 5B, after completing the first bond, the second bond is started. A top-side bonding material 540, which may be a suitable TLP material as described above, is applied between the top-side metal layer 520 and a top-side bonding objective 560. In FIG. 5C, the second bonding is complete, completing the double-sided bonding.

This sequential process is possible because the melting temperature of the new alloy is higher than the process temperature, thus allowing the bonding process to repeat without damaging the pre-bonded bondline. In FIG. 5C, the bottom-side bonding material 550 is not damaged by the bonding process of the top-side bonding material 540. However, because the bonding time itself is longer than soldering as it requires melting, diffusion, and solidification, and because the bonding process is performed twice, this sequential process requires a longer time than a sequential process with soldering or a simultaneous bonding with TLP or soldering. In addition, controlling the bondline quality may be difficult, or requires a very long bonding time to ensure the proper ratio of alloys to form a desired bondline.

The present invention takes advantage of the higher re-melting temperature with respect to the process temperature to share the thermal budget from the second bonding to complete the first bonding. The concept of sharing the thermal budget is applicable to both the case when the same TLP material combination is used and the case when different TLP material combinations (or thicknesses) are used. In the various implementations discussed below, with respect to FIGS. 6A-6D, 8A-8C, and 9A-9D, the device may be an electronic device such as a power module or other semiconductor device, such as IGBTs, MOSFETs, JFETs, diodes, etc. The metal layers may be one or more metals, in separate layers or an alloy, which may be electrically and/or thermally conductive. In addition, the metal layers may be plated with a thin layer of another metal, such as gold. The bonding objectives may be additional electronic devices or components, or alternatively be cooling devices. The bonding material may be a combination of materials suitable for TLP, such as the material combinations of Table 1.

Figure 6A:
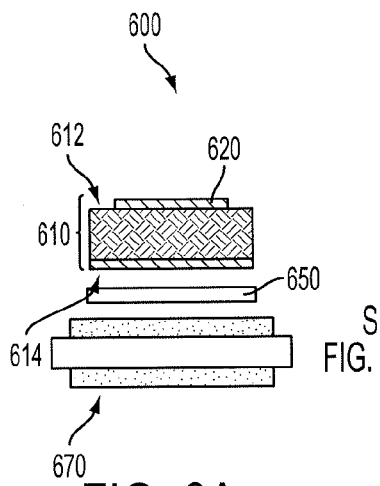
FIGS. 6A-6D depict cross-sectional views of a sequential double-sided bonding process according to one implementation of the present invention.

FIGS. 6A-6D illustrates a sequential double-sided bonding process 600, wherein the same TLP material combination is used for both sides. In FIG. 6A, a device 610 has a top side 612, upon which a top-side metal layer 620 is disposed, and a bottom side 614, upon which a bottom-side metal layer 630 is disposed. A bottom-side bonding material 650, for example, a suitable TLP material, is applied between the bottom-side metal layer 630 and a bottom-side bonding objective 670. However, unlike in FIG. 5, the first bonding is not complete, as shown by a partially completed bottom-side bonding material 655 in FIG. 6D. The partially completed bottom-side bonding material 655 is not completely bonded, comprising one alloy and a parent material rather than two alloys, as in FIG. 4A. In other words, the first bonding process is stopped before the transformation of the bottom-side bonding material 650 is complete.

Figure 6B:
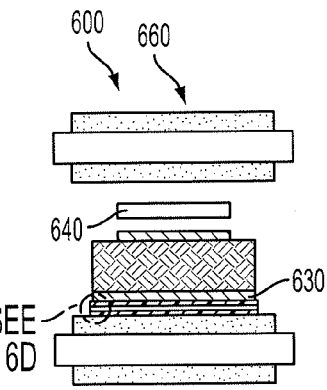
Figure 6C:
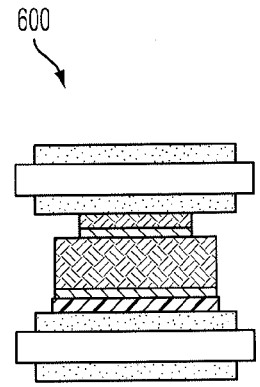
Figure 6D:
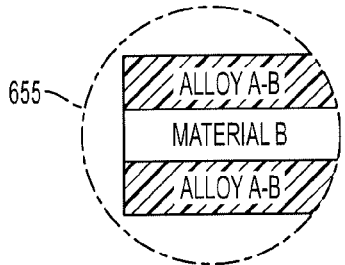

In FIG. 6B, the top-side bonding process is conducted. A top-side bonding material 640, the same material as the bottom-side bonding material 650, is applied between the top-side metal layer 620 and a top-side bonding objective 660. In FIG. 6C, both the bottom-side bonding material 650 and the top-side bonding material 640 are completely bonded as a result of the second bonding process. Because the second bonding is the same process as the first bonding, the partially completed bottom-side bonding material 655 re-starts its melting, diffusion, and solidification process during the second bonding process. The second bonding also completes the transformation of the top-side bonding material 640. Because the first bonding process is not originally carried out to completion, this sequential process decreases the total bonding time needed. In addition, although a homogeneous bondline may be formed when the bonding processes are complete, in other implementations, the bonding processes may end with a non-homogeneous bondline.

Figure 7:
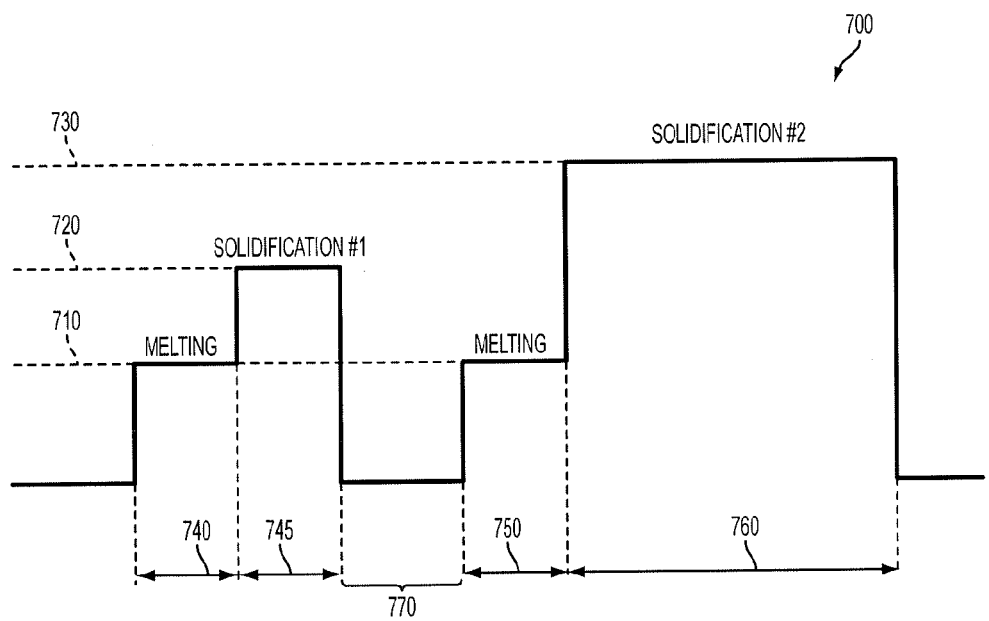
FIG. 7 depicts a diagram of a process profile of the sequential double-sided bonding process of FIG. 6 according to one implementation of the present invention.

FIG. 7 depicts a process profile 700 of the double-sided bonding process 600. The process profile 700 represents a conceptual diagram and is not drawn to scale. After the bottom-side bonding objective 670 is aligned with the device 610 and placed inside a fixture or other appropriate means for securing the device 610 during the bonding, the first bonding process starts with raising the temperature to a melting temperature 710 for a time period 740. Then, the temperature is raised to a first solidification temperature 720 for a time period 745. The first solidification temperature is not maintained for a long enough time to completely transform (i.e., diffuse and solidify) the bottom-side bonding material 650, resulting in the partially completed bottom-side bonding material 655.

During a time period 770, the temperature is reduced. Although the partially completed bottom-side bonding material 655 is not completely transformed, enough material has melted and diffused to create a bond. The device 610 may optionally be removed to check for alignment.

Next, the device 610 may be returned to the fixture to start the second bonding process. The temperature is again raised to the melting temperature 710 because the top-side bonding material 640 is the same as the bottom-side bonding material 650, i.e., the same processing temperatures may be used. The melting temperature 710 is maintained for a time period 750. During this time, the partially completed bottom-side bonding material 655 is not damaged, but rather continues its melting process.

Then, the temperature is raised to a diffusion/solidification temperature 730, referred to as the second solidification temperature 730. The second solidification temperature 730 is held for a time period 760, which is sufficient for the partially completed bottom-side bonding material 655 and the top-side bonding material 640 to completely transform. Because the time period 760 is not repeated (i.e., the time period 745 is less than the time period 760), the total processing time is greatly reduced.

Figure 8C:
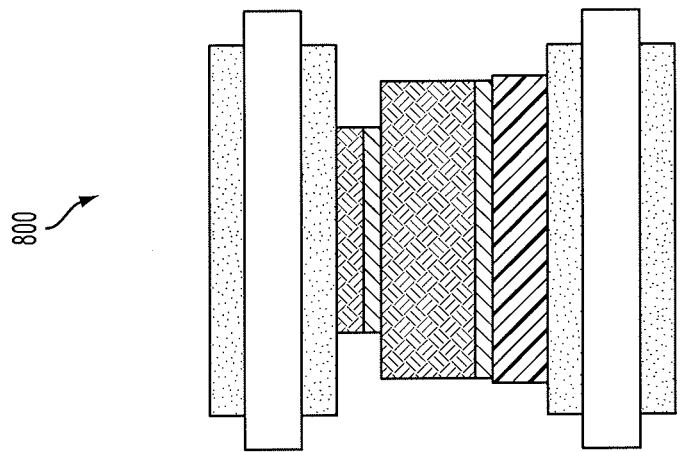
FIGS. 8A-8C depict cross-sectional views of a sequential double-sided bonding process using different thicknesses of bonding material according to one implementation of the present invention.
Figure 8B:
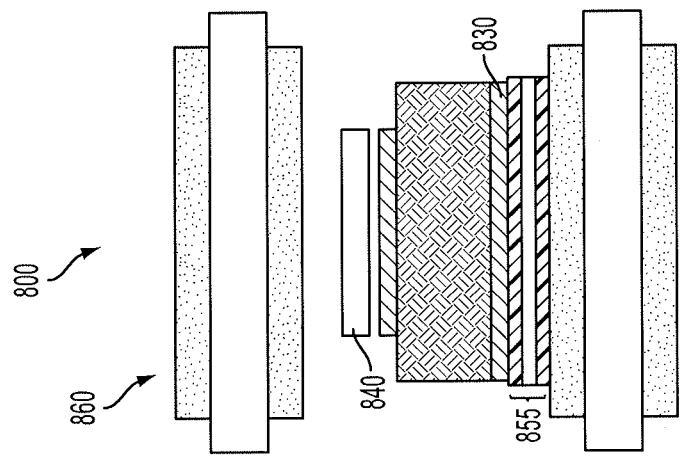
Figure 8A:
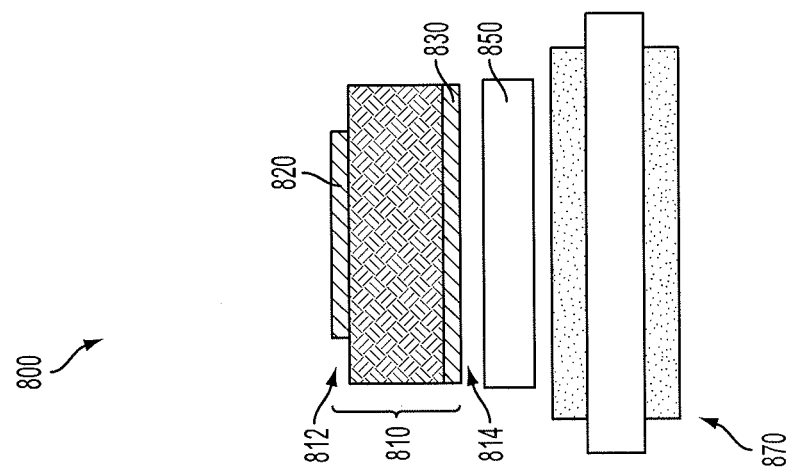

Other TLP material combinations and variations, such as variations in thicknesses, may be utilized. A sequential double-sided bonding process 800 in FIGS. 8A-8C illustrates one implementation wherein one side (the bottom side, although in other implementations the top side) requires a thicker bonding thickness than the other side. In FIG. 8A, a device 810 has a top side 812, upon which a top-side metal layer 820 is disposed, and a bottom side 814, upon which a bottom-side metal layer 830 is disposed. A bottom-side bonding material 850 is applied between the bottom-side metal layer 830 and a bottom-side bonding objective 870. The bottom-side bonding material 850 is thicker than a top-side bonding material 840 applied between the top-side metal layer 820 and a top-side bonding objective 860.

The first bonding process starts in FIG. 8A, similar to FIG. 6A. However, the first bonding time is adjusted to make the amount of the left-over or untransformed center material in a partially completed bottom-side bonding material 855 (i.e., material B in FIG. 3) to be smaller than the amount of center material (i.e., material B in FIG. 3) in the top-side bonding material 840, as seen in FIG. 8B. This ensures that the thermal energy from the second bonding process is sufficient to complete the first bonding process, as seen in FIG. 8C.

Figure 9A:
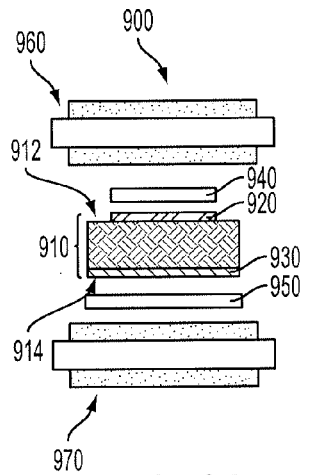
FIGS. 9A-9D depict cross-sectional views of a simultaneous double-sided bonding process according to one implementation of the present invention.

Although the sequential process reduces processing time, a simultaneous process may reduce even more processing time. FIGS. 9A-9D depict a simultaneous double-sided bonding process 900. A device 910 has a top side 912, upon which a top-side metal layer 920 is disposed, and a bottom side 914, upon which a bottom-side metal layer 930 is disposed. As seen in FIG. 9A, both a top-side bonding objective 960 and a bottom-side bonding objective 970 are aligned over a top-side bonding material 940 and a bottom-side bonding material 950, respectively. The bottom-side bonding material 950 has a lower bonding temperature than the top-side bonding material 940, although in other implementations this may be reversed.

Figure 10:
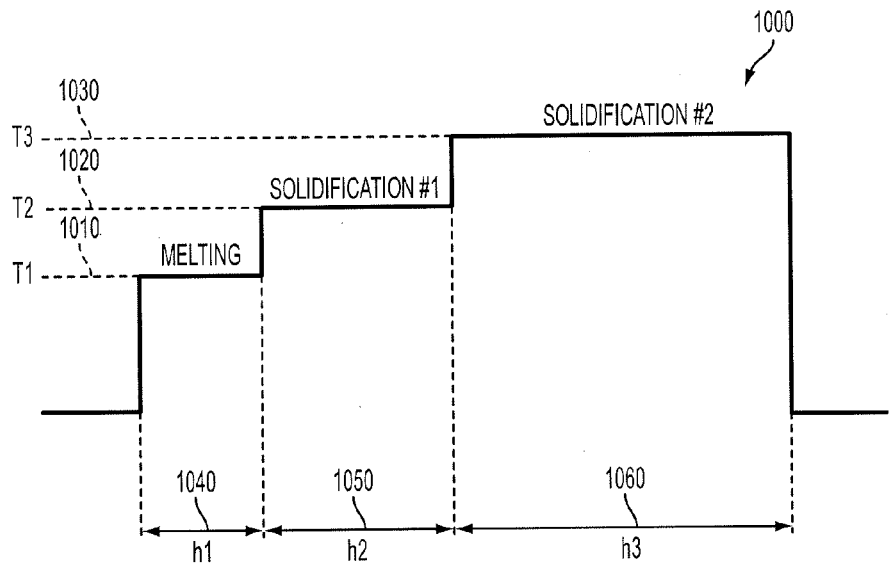
FIG. 10 depicts a diagram of a process profile of the sequential double-sided bonding process of FIG. 9 according to one implementation of the present invention.

FIG. 10 illustrates a process profile 1000 of the simultaneous double-sided bonding TLP process 900. The process profile 1000 is not drawn to scale. In FIG. 9A, after the alignment, the temperature is raised to a melting temperature 1010 (the lower temperature) of the bottom-side bonding material 950 (in particular the center material) for a time period 1040. The melting temperature 1010 is maintained until the center material of the bottom-side bonding material 950 and the center material of the top-side bonding material 940 are completely melted.

Figure 9B:
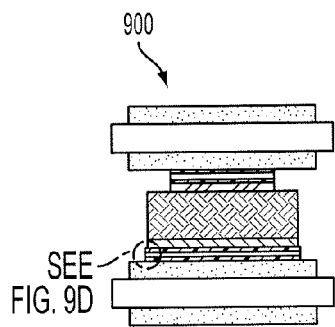

In FIG. 9B, the temperature is then raised to a first solidification temperature 1020, which is the diffusion/solidification temperature of the bottom-side bonding material 950, the first material. The first solidification temperature 1020 is held for a time period 1050, which allows the bottom-side bonding material 950 to diffuse and react. However, the first bonding is not completed before starting the second bonding process, as indicated by the partially completed bottom-side bonding material 955.

Figure 9C:
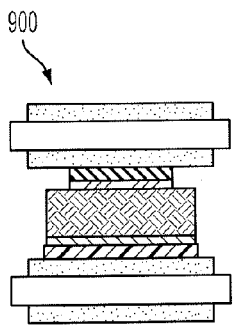
Figure 9D:
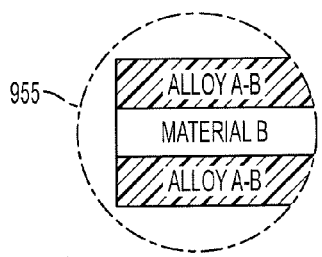

The temperature is raised to a second solidification temperature 1030, which is the diffusion/solidification temperature of the top-side bonding material 940. The second solidification temperature 1030 is maintained for a time period 1060, which is sufficient time to complete the first and second bonding processes, as seen in FIG. 9C.

Compared to FIG. 7, FIG. 10 lacks the time period 745 for a first partial solidification, and the time period 770 between bonding processes. Further, since the first bonding process utilizes the thermal energy of the second bonding process, the total processing time is reduced. The increased temperature of the second bonding process further increases the diffusion and reaction speed of the first bonding process. Thus, the simultaneous double-sided bonding process may improve processing times over the sequential double-sided bonding process.

The advantages of the present invention include, but are not limited to, customizability to choose between a sequential or simultaneous bonding process, greatly reducing bonding time without the introduction of new materials, structure, or processes (particularly advantageous for mass production), less dependent on fabrication conditions and no requirement for long bonding times (also important for mass production), providing excellent contact and good electrical and thermal conductivity to bonded devices, which secures device performance as well as bonding quality, the option to use different materials or conduct pre-treatment of material surfaces, enabling flexible fabrication process design and applicable to many applications, and compatibility with conventional fabrication techniques.

Those of ordinary skill will appreciate that the various illustrative logical blocks and process steps described in connection with the examples disclosed herein may be implemented as electronic hardware, computer software, or combinations of both. Whether such functionality is implemented as hardware or software depends upon the particular application and design constraints imposed on the overall system. Ordinarily skilled artisans may implement the described functionality in varying ways for each particular application, but such implementation decisions should not be interpreted as causing a departure from the scope of the disclosed apparatus and methods.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The foregoing description of the disclosed example implementations is provided to enable any person of ordinary skill in the art to make or use the present invention. Various modifications to these examples will be readily apparent to those of ordinary skill in the art, and the principles disclosed herein may be applied to other examples without departing from the spirit or scope of the present invention. The described implementations are to be considered in all respects only as illustrative and not restrictive and the scope of the present invention is, therefore, indicated by the following claims rather than by the foregoing description. All changes which come within the meaning and range of equivalency of the claims are to be embraced within their scope.

What is claimed is:

1. A transient liquid phase (TLP) bonding method for double-sided bonding comprising:
    placing a first bonding material between an electronic device and a first bonding objective, the first bonding material having a first solidification temperature and including a first material having a first melting point and a second material having a second melting point less than the first melting point;
    aligning the first bonding objective with a first side of the electronic device;
    starting a first bonding process by raising a temperature to the second melting point to melt the second material;
    interrupting the first bonding process by reducing the temperature before the second material is completely diffused;
    placing a second bonding material between the electronic device and a second bonding objective, the second bonding material having a second solidification temperature and including a third material having a third melting point and a fourth material having a fourth melting point less than the third melting point;
    aligning the second bonding objective with a second side of the electronic device opposite the first side;
    starting a second bonding process by raising the temperature to the second solidification temperature;
    completing the first bonding process during the second bonding process by forming a first bondline from the first bonding material; and
    completing the second bonding process by forming a second bondline from the second bonding material.

2. The method of claim 1, wherein the first bondline comprises a first substantially homogeneous bondline, and the second bondline comprises a second substantially homogeneous bondline.

3. The method of claim 1, wherein the first bonding material is thicker than the second bonding material.

4. The method of claim 3, wherein the starting the first bonding process by raising the temperature to the second melting point further comprises maintaining the second melting point such that an amount of the second material not diffused is smaller than an amount of the third material before starting the second bonding process.

5. The method of claim 1, wherein the first bonding material further comprises the second material sandwiched between two layers of the first material, and the second bonding material further comprises the fourth material sandwiched between two layers of the third material.

6. The method of claim 1, wherein the first bonding material is the same as the second bonding material.

7. The method of claim 1, wherein the electronic device further comprises a metal layer on the first side of the electronic device or the second side of the electronic device.

8. The method of claim 7, wherein the metal layer comprises gold.

9. The method of claim 1, wherein the first bonding objective is a collector plate and the second bonding objective is an emitter plate.

10. The method of claim 1, wherein the first bonding objective or the second bonding objective is a cooling device.

11. The method of claim 1, wherein the first bonding objective or the second bonding objective is an electronic component.

12. A transient liquid phase (TLP) bonding method for double-sided bonding comprising:
    placing a first bonding material between an electronic device and a first bonding objective, the first bonding material having a first solidification temperature and comprising a first material having a first melting point and a second material having a second melting point less than the first melting point;
    aligning the first bonding objective with a first side of the electronic device;
    placing a second bonding material between the electronic device and a second bonding objective, the second bonding material having a second solidification temperature and comprising a third material having a third melting point and a fourth material having a fourth melting point less than the third melting point, the first solidification temperature less than the second solidification temperature;
    aligning the second bonding objective with a second side of the electronic device opposite the first side;
    starting a first bonding process by raising a temperature to the second melting point to melt the second material;
    maintaining the second melting point until the second material is completely melted;
    raising the temperature to the first solidification temperature to diffuse the first and second materials;
    starting a second bonding process before the first bonding process is complete by raising the temperature to the second solidification temperature;
    completing the first bonding process during the second bonding process by forming a first bondline from the first bonding material; and
    completing the second bonding process by forming a second bondline from the second bonding material.

13. The method of claim 12, wherein the first bondline comprises a first substantially homogeneous bondline and the second bondline comprises a second substantially homogeneous bondline.

14. The method of claim 12, wherein the first bonding material is thicker than the second bonding material.

15. The method of claim 12, wherein the first bonding material further comprises the second material sandwiched between two layers of the first material, and the second bonding material further comprises the fourth material sandwiched between two layers of the third material.

16. The method of claim 12, wherein the first bonding material is the same as the second bonding material.

17. The method of claim 12, wherein the electronic device further comprises a first metal layer on the first side of the electronic device and a second metal layer on the second side of the electronic device.

18. A transient liquid phase (TLP) bonding method for double-sided bonding comprising:
   placing a first bonding material between an electronic device and a first bonding objective, the first bonding material having a first solidification temperature and comprising a first material having a first melting point and sandwiched between two layers of a second material having a second melting point less than the first melting point;
   aligning the first bonding objective with a first side of the electronic device;
   raising a temperature to the second melting point to form a first partially complete bonding material from the first bonding material;
   placing a second bonding material between the electronic device and a second bonding objective, the second bonding material having a second solidification temperature and comprising a third material having a third melting point and sandwiched between two layers of a fourth material having a fourth melting point less than the third melting point;
   aligning the second bonding objective with a second side of the electronic device opposite the first side;
   raising the temperature to the second solidification temperature;
   forming a first bondline from the first partially complete bonding material while the temperature is at the second solidification temperature; and
   forming a second bondline from the second bonding material.

19. The method of claim 18, further comprising reducing the temperature after forming the first partially complete bonding material.

20. The method of claim 18, wherein the first partially complete bonding material comprises the first material partially diffused into the two layers of the second material.

* * * * *